United States Patent [19]

Dahlberg

[11] 4,441,115

[45] Apr. 3, 1984

[54] THYRISTOR HAVING A CENTER PN JUNCTION FORMED BY PLASTIC DEFORMATION OF THE CRYSTAL LATTICE

[75] Inventor: Reinhard Dahlberg, Flein, Fed. Rep. of Germany

[73] Assignee: Higratherm Electric GmbH, Heilbronn, Fed. Rep. of Germany

[21] Appl. No.: 165,106

[22] Filed: Jul. 1, 1980

[30] Foreign Application Priority Data

Jul. 3, 1979 [DE] Fed. Rep. of Germany ....... 2926734

[51] Int. Cl.³ .................... H01L 29/06; H01L 27/14; H01L 29/74
[52] U.S. Cl. ........................................ 357/38; 357/20; 357/30; 357/32; 357/55
[58] Field of Search ............... 357/38, 32, 55, 38 LA, 357/38 E, 38 R, 30 D, 30 H, 30 I, 13, 79, 20

[56] References Cited

U.S. PATENT DOCUMENTS

| 3,152,928 | 11/1964 | Hubner | 357/20 |
| 4,016,593 | 4/1977 | Konishi et al. | 357/38 |

FOREIGN PATENT DOCUMENTS

| 1207502 | 12/1965 | Fed. Rep. of Germany | 357/20 |
| 1514727 | 9/1969 | Fed. Rep. of Germany | 357/20 |
| 2508689 | 9/1976 | Fed. Rep. of Germany | 357/30 A |
| 2547262 | 4/1977 | Fed. Rep. of Germany | 357/55 |
| 2738160 | 3/1979 | Fed. Rep. of Germany | 357/55 |
| 2837394 | 3/1980 | Fed. Rep. of Germany | 357/55 |
| 54-10232 | 5/1979 | Japan | 357/55 |

OTHER PUBLICATIONS

S. Schaefer, "Herstellung Von p-n-Uebergaengen Durch Gemeinsame Plastische Verformung Von p- Und n- Dotiertem Germanium", *Solid-State Electronics*, vol. 11, (1968), 675–681.

*Primary Examiner*—Andrew J. James
*Assistant Examiner*—J. Carroll
*Attorney, Agent, or Firm*—Spencer, Kaye & Frank

[57] ABSTRACT

A thyristor comprises two semiconductor plates, discs or chips, one n-doped and one p-doped, each having a structure of parallel ridges on one major surface and an opposite conducting type layer on the other major surface, two plates, discs or chips being assembled together under pressure with the structured surfaces facing and rotated relative to each other so that the ridges cross and touch to form pn junctions produced by plastic deformation of the crystal lattice and pnpn layer sequences. The invention also includes a method of manufacturing such thyristors.

11 Claims, 3 Drawing Figures

THYRISTOR HAVING A CENTER PN JUNCTION FORMED BY PLASTIC DEFORMATION OF THE CRYSTAL LATTICE

BACKGROUND OF THE INVENTION

The invention relates to a thyristor in which the center of the three pn-junction of a pnpn structure is produced by means of plastic deformation.

Thyristors are used on a large scale in electronics, chiefly in power electronics. Thyristors having switching powers in the megawatt range are available today for high voltage current applications. Thyristors fired by light operate particularly reliably at high voltages because they do not require an electrical firing electrode. An infra-red luminescent diode comprising GaAs usually serves as the light source for firing. The frequency limit of these thyristors is generally approximately in the region of a few kHz.

SUMMARY OF THE INVENTION

It is an object of the invention to provide high frequency thyristors which are suitable for firing by means of light and conventional means while at the same time being at high power.

According to a first aspect of the invention, there is provided a thyristor having a pn junction produced by means of plastic deformation, in which an n-doped and a p-doped monocrystalline semiconductor plate, disc or chip are provided; one major side of both plates, discs or chips has a region of the reverse or opposite type of conductivity in each case; that both semiconductor plates, discs or chips have a structure with parallel ridges on the opposite major side, and the two semiconductor plates, discs or chips are assembled with their structured sides facing to form a pnpn sequence of regions; the ridges of both semiconductor plates, discs or chips cross and touch; and the areas of contact form electrically parallel connected pn-junctions as a result of plastic deformation of the semiconductor lattice.

According to a second aspect of the invention, there is provided a method of manufacturing a thyristor comprising forming a structure of parallel ridges on one side of each of an n-doped and a p-doped semiconductor plate, disc or chip having a respectively opposite conductivity type region on its opposite side, and connecting said plates, discs or chips together under pressure with their structured sides facing and rotated relative to each other so that said ridges on one said plate, disc or chip cross and touch said ridges on said other plate, disc or chip to form pn junctions produced by plastic deformation of the crystal lattice and pnpn sequences.

BRIEF DESCRIPTION OF THE DRAWING

The invention will now be described in greater detail by way of example, with reference to the drawings, in which.

DESCRIPTION OF THE PREFERRED EMBODIMENTS

Figure 1A:
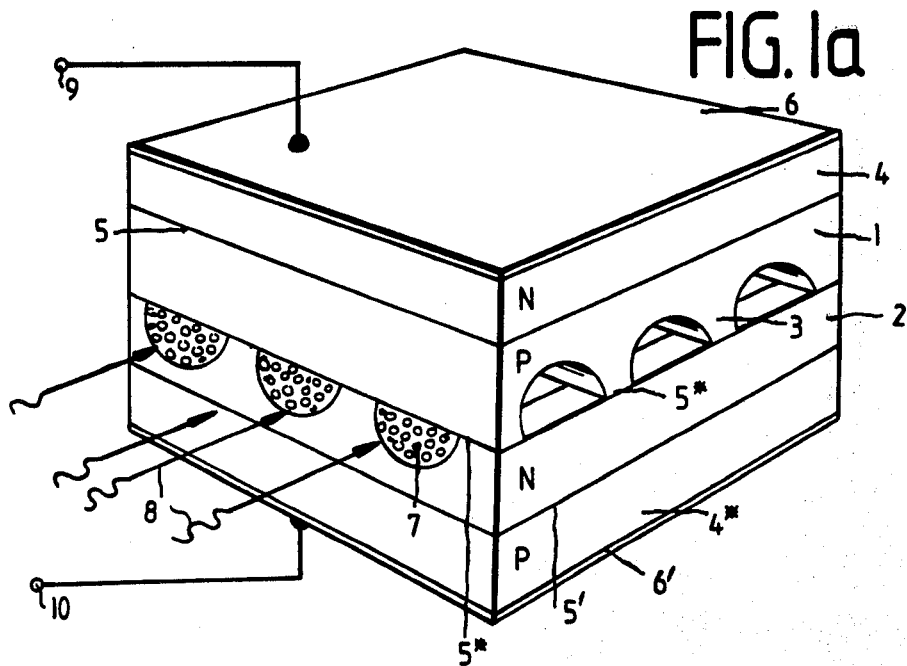
FIG. 1a is a perspective view of a light fired rapid power transistor.

Basically, the invention proposes to provide a thyristor having an n-doped and a p-doped monocrystalline semiconductor plate, disc or chip, with one side of both plates, discs or chips supporting a region of the opposite type of conductivity and both semiconductor plates, discs or chips having a structure of parallel ridges on the other of their two sides. The two semiconductor plates discs or chips are assembled together with their structured sides facing to form a pnpn sequence of regions with the ridges of both semiconductor discs being arranged to cross and touch, and the areas of contact forming electrically parallel pn junctions as a result of plastic deformation of the semiconductor lattice.

The semiconductor plates, discs or chips are pressed together in order to bring about the required plastic deformation at the areas of contact, preferably by means of mechanical pressure at an elevated temperature.

The principle of the crossed parallel ridges has already been described in German Offenlegungsschrift No. P 2547262. However, the development of this principle to enable a thyristor to be produced was not mentioned.

It is known from the publication S. Schafer "Manufacture of pn-junctions by joint plastic deformation of p and n doped germanium". Solid-State-Electronics, 11, 675-681 (1968) to produce pn-junctions by deforming a p and n crystal of silicon or germanium jointly under pressure and at a fairly high temperature. As long as the degree of deformation is not greater than $\sim 3\%$, (dislocation density less than $10^6/cm^2$) pn-junctions having good electrical properties may be produced according to this technique.

If the number of parallel ridges on each semiconductor plate, disc or chip is N, then $N^2$ electrically parallel pn-junctions are formed between the two semiconductor plates, discs or chips in the manner described. The pn-junctions have the same good heat dissipation as small area contacts between two elements. As is known, the permitted power densities $P=[watts/cm^2]$ rise in such a contact in proportion to $1/2D$, if $2D$ is the diameter of the contact. The power density (with a constant junction temperature) in the $N^2$ parallel pn-junctions increases (for the flow direction and blocking direction) by $1/2D$ if $2D$ is the diameter of a pn-junction. If, with a certain outer cooling at the connections of a conventional thyristor having 1 cm$^2$ area, the power density equals $P \approx 50$ watts/cm$^2$, then the similarly permitted power density in a contact having the diameter $2D=1.10^{-3}$ cm is approximately $P \approx 50$ kilowatts/cm$^2$—i.e., the heat resistance of the thyristor junction is negligible in accordance with the invention as compared to other heat resistances of the arrangement.

The structure with the ridges on one side of the semiconductor plates, discs or chips may be manufactured in a manner known per se with the aid of a chemical, electrochemical or plasma etching process. Ridges may also be produced by means of structure etching, for example in a 100 crystal plane area of a monocrystalline silicon plate, these ridges taper on both sides with a slope of approximately 54° towards the free outer face.

The structure with the ridges may be produced mechanically, e.g. by sawing.

The region of the reverse or opposite type of conductivity may be formed in a manner known per se by means of a diffusion process, by means of ion implantation, or by an epitaxial process.

The two semiconductor discs support a nonblocking contact on their second surface.

After transformation of the contact areas between the semiconductor plates, discs or chips, the surface of the structures may be coated with an insulating and protective layer. This protective layer may be a thermal oxide layer by way of example. However it may also be a passivating glass layer.

Firing the thyristor may take place with the aid of light which is radiated or diffused into the intermediate spaces between the two semiconductor plates discs or chips or the parallel ridges.

A light conductive substance such as quartz powder may be located at the edge or in the intermediate spaces between the two plates, discs or chips.

The infra-red light of a GaAs light-emitting diode may be used as the light for firing.

However, a non-blocking contact may be arranged at one region of opposite type of conductivity, the thyristor being electrically fired by means of this contact.

Two embodiments of the invention will now be described with reference to the drawings, wherein:

Embodiment 1 is a rapid power thyrisor fired by light, and

Embodiment 2 is a power thyristor with electrical firing.

Embodiment 1

In FIG. 1, 1 is a flat and parallel 500 $\Omega$ cm p-silicon plate having an area of $5\times 5$ cm$^2$ and a thickness of $5\cdot 10^{-2}$ cm. On one side of this plate 1, an n-region 4 is formed by total surface diffusion of arsenic up to a depth of $2\cdot 10^{-2}$ cm with a surface concentration $>10^{20}$ atoms/cm$^3$. As a result of the region 4, a pn junction 5 is formed in plate 1.

Plate 2 is a flat and parallel 500 $\Omega$ cm n-silicon plate of $5\times 5$ cm$^2$ area and a thickness of $5\cdot 10^{-2}$ cm. On one side or major surface of this plate 2, a p-region 4* has been formed by total surface diffusion of boron of $>10^{20}$ atoms/cm$^3$. Due to the region 4* a pn junction 5' formed in plate 2.

The non-diffused surfaces of the plates 1 and 2 have a structure with parallel ridges 3 which taper towards their free outer face. The outer face or the edge 11 of the ridges 3 has a width of $10^{-3}$ cm for example. The spacing of the ridges 3 from one edge 11 to the next edge 11 is $1\cdot 10^{-2}$ cm. The two plates 1 and 2 are rotated with respect to each other by 90° in the plane of the discs in relation to their ridge structures—as shown in FIG. 1a—and are placed on top of one another under mechanical pressure so that the ridges 3 cross at their edge faces and touch. At a temperature of approximately 800° C., the areas of contact are then transformed into a total of $2.5\cdot 10^5$ electrically parallel connected pn-junctions 5* as a result of a small deformation of the silicon lattice. Then the non-contacting surface of the ridges which is still exposed is coated with a thin thermal oxide layer. Finally non blocking metal contacts and 6' are arranged on the diffusion layers 4 and 4* respectively of both plates 1 and 2. An anode connection 9 is applied to the non blocking metal contact 6 of the plate 1, and a cathode contact 10 is arranged on the non blocking metal contact 6' of the plate 2. Due to the incidence of infra-red light 8 from a GaAs light-emitting diode, which takes place in parallel with the ridges 3 into the intermediate areas between the plates 1 and 2, which are filled with fine quartz powder 7, the thyristor is ignited virtually without any delay in ignition.

Figure 1B:
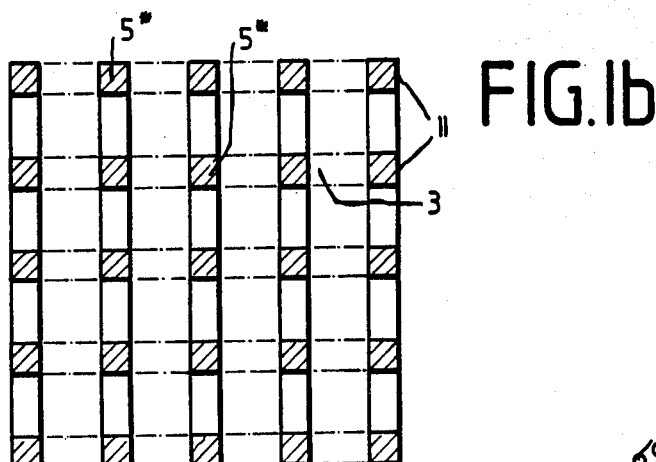
FIG. 1b is a sectional view of a transistor shown in FIG. 1a taken through the contact areas.

FIG. 1B shows the arrangement of the $2.5\cdot 10^5$ electrically parallel pn-junction 5* in terms of their area schematically in a sectional view along the plane of contact of the two semi-conductor discs 1 and 2, each junction 5* having an area of $1\cdot 10^{-6}$ cm$^2$ which is formed by the edge areas of the ridges 3 which are in contact.

Embodiment 2

Figure 2:
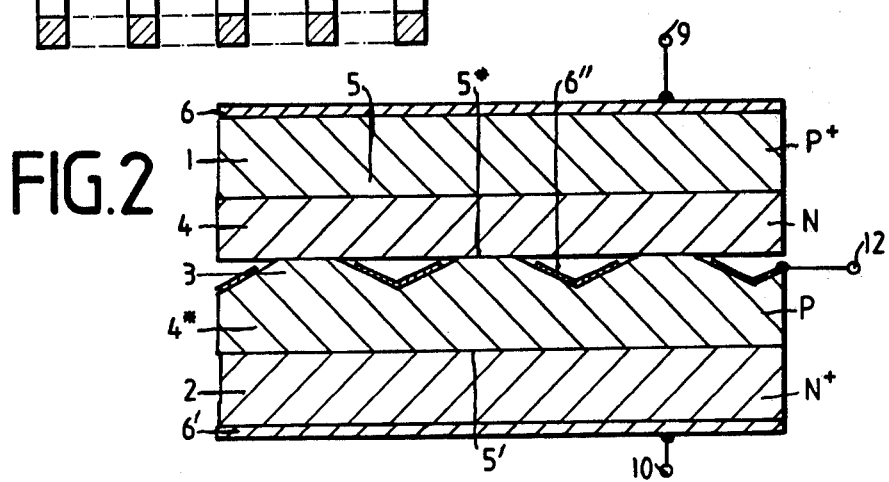
FIG. 2 is a sectional view of a power transistor with electrical firing.

In FIG. 2, 1 is a p+-silicon plate on to which a 1 $\Omega$ cm n-silicon layer 4 is applied epitaxially with a thickness of $4\cdot 10^{-3}$ cm to a pn junction 5. Plate 2 is an n+-silicon plate on to which a 10 $\Omega$ cm p-silicon layer 4* of $4\cdot 10^{-3}$ cm in thickness is applied epitaxially to form a pn junction 5'. The silicon plates 1 and 2 are oriented. Both epitaxial layers 4 and 4* have a structure of tapering and parallel ridges 3 which were produced by a structure etching process and extend into the layers 4 or 4*. The outer or edge faces of the ridges have a width of $5\cdot 10^{-4}$ cm, their spacing from each other is $1.5\cdot 10^{-3}$ cm. The plates 1 and 2 are placed one on top of the other so that the ridges 3 cross and, after heat treatment at the areas of contact, pn-junctions 5* with an area of $2.5\cdot 10^{-7}$ cm$^2$ are formed. Before placing together the discs 1 and 2, the sloping surfaces of the ridges 3 in the structure of the plate 2 were coated with a tungsten layer 6" of $5\cdot 10^{-1}$ cm in thickness by means of a masking process, the firing electrode connection 12 being applied to this tungsten layer 6". Alternatively, the layer 6" could be formed of molybdenum.

The anode connection 9 is applied to the nonrectifying contact 6 of the plate 1 and the cathode connection 10 is applied to the nonrectifying contact 6' of the plate 2.

What is claimed is:

1. A thyristor having a pn junction produced by plastic deformation of the crystal lattice comprising in combination: a first monocrystalline semiconductor disc of one conductivity type having a region of the opposite conductivity type on one major surface; a second monocrystalline semiconductor disc of said opposite conductivity type having a region of said first conductivity type on one major surface; a means for electrically contacting said one major surface of each said disc; a structure with parallel ridges with walls and with spaces therebetween formed in the opposite major surface of each of said first and second semiconductor discs; and said first and second semiconductor discs, assembled with their said structured opposite major surfaces facing and with said ridges intersecting and contacting one another, form a plurality of parallelly connected pn junctions due to plastic deformation of the semiconductor lattice at the areas of contact, and a sequence of four semiconductor regions of alternating opposite conductivity type.

2. A thyristor as defined in claim 1 wherein said spaces between said walls extend to the edges of said discs and are able to receive light radiation or strong light directed toward the edge surface of said thyristor so as to optically fire said thyristor.

3. A thyristor as defined in claim 1 wherein said means for electrically contacting comprises a separate non blocking contact for the respective said region on said one major surface of each of said first and second semiconductor discs.

4. A thyristor as defined in claim 2 wherein a light is provided for firing the thyristor and is radiated or distributed into said spaces.

5. A thyristor as defined in claim 2 further comprising a light conductive substance located in said spaces, at least at the edge of said discs.

6. A thyristor as defined in claim 5, wherein said light conductive substance comprises quartz powder.

7. A thyristor as defined in claim 1 further comprising an electrical contact arranged on one of the regions bordering said pn-junctions formed by plastic deformation, said electrical contact forming the electrical firing contact of the thyristor.

8. A thyristor as defined in claim 7 wherein said electrical firing contact comprises a layer of tungsten/metal or molybdenum/metal.

9. A thyristor as defined in claim 2, wherein said thyristor comprises a high frequency power thyristor.

10. A thyristor as defined in claim 1, wherein said first and second semiconductor discs are joined together to form said pn-junctions due to plastic deformation of the semiconductor lattice by the application of mechanical pressure at an elevated temperature.

11. A thyristor as defined in claim 7 wherein said electrical firing contact is disposed within said spaces and on the side surfaces of said walls on one of said first and second semiconductor discs.

* * * * *